United States Patent [19]
Bhushan et al.

[11] Patent Number: 5,558,903
[45] Date of Patent: Sep. 24, 1996

[54] METHOD FOR COATING FULLERENE MATERIALS FOR TRIBOLOGY

[75] Inventors: Bharat Bhushan, Powell; James V. Coe, Jr.; Balkishan Gupta, both of Worthington, all of Ohio

[73] Assignee: The Ohio State University, Columbus, Ohio

[21] Appl. No.: 326,345

[22] Filed: Oct. 20, 1994

Related U.S. Application Data

[63] Continuation of Ser. No. 75,135, Jun. 10, 1993, abandoned.
[51] Int. Cl.$^6$ ............................ C01B 31/02; C23C 14/06
[52] U.S. Cl. .................. 427/11; 427/249; 423/445 B; 423/DIG. 39; 423/DIG. 40; 428/408
[58] Field of Search .................. 423/445 B, DIG. 39, 423/DIG. 40; 23/294 R; 252/29, 30; 427/11, 249; 428/408

[56] References Cited

U.S. PATENT DOCUMENTS

| | | | |
|---|---|---|---|
| 5,049,915 | 3/1992 | Subamaniam | 423/446 |
| 5,234,474 | 8/1993 | Whewell | 44/282 |
| 5,269,953 | 12/1993 | Whewell | 252/30 |
| 5,271,890 | 12/1993 | Shimura et al. | 427/249 |
| 5,374,463 | 12/1994 | Bethune et al. | 428/408 |
| 5,380,595 | 1/1995 | Ueba et al. | 428/408 |

FOREIGN PATENT DOCUMENTS

| | | |
|---|---|---|
| 9204279 | 3/1992 | WIPO . |
| 9204350 | 11/1992 | WIPO . |

OTHER PUBLICATIONS

Reber, C. "Luminescence and Absorption Spectra of $C_{60}$ Films", J. Phys. Chem., 1991, vol. 95, pp. 2127–2129.

Eom, C. B., et al. "Fabrication and Properties of Free–Standing $C_{60}$ Membranes"., Science, vol. 259, pp. 1887–1890 (26 Mar. 1993).

Daly et al., "Fullerenes From a Fulgurite" Science vol. 259, Mar. 12 1993 pp. 1599–1601.

Boseck et al., "Fullerenes From the Geological Environment," Science, vol. 257, Jul. 10, 1992, pp. 215–217.

"Mass Spectrometric, Thermal, & Separation Studies of Fullerenes," 1992, pp. 117–125.

Kratschmer, et al. "Solid $C_{60}$ . . . ", Nature, vol. 347, pp. 354–358 (#6271), 27 Sep. 1990.

Hebard, A. F., et al. "Deposition and Characterization of Fullerene Films", Applied Physics Letters, vol. 59, #17, pp. 2109–2111, (21 Oct. 1991).

Zhennan, G. et al. "Buckminster Fullerene $C_{60}$ . . . ", Journal of Physical Chemistry, vol. 95 #24, pp. 9615–9618 (28 Nov. 1991).

Li et al., "Ordered Overlayers of $C_{60}$ on GA As (110) Studied with Scanning Tunneling Microscopy", Science, vol. 252, Apr. 26, 1991 pp. 547–548.

Haddon et al. "Conducting Films of $C_{60}$ and $C_{70}$ by Alkali Metal Doping", Nature, vol. 350, Mar. 28, 1991, pp. 320–322.

Blau et al. "An Investigation of the Microfrictional Behavior of $C_{60}$ Particle Layers on Aluminum", Thin Solid Films vol. 219, Oct. 30, 1992, pp. 129–134.

(List continued on next page.)

Primary Examiner—Steven Bos
Assistant Examiner—Peter DiMauro
Attorney, Agent, or Firm—Frank T. Kremblas, Jr.; Kremblas, Foster, Millard & Pollick

[57] ABSTRACT

The invention relates to an improved synthesis of fullerene ($C_{60}$) films, whereby improved purity and adhesion to a substrate are achieved. The invention is not limited to $C_{60}$ molecules and other fullerenes and fullerene based materials, including for example, metallofullerenes, fluorinated fullerenes, and codeposition of fullerene and other solid lubricants. The invention also relates to the use of these fullerene materials in oils, greases, polymers and other materials, both organic and inorganic, for improving lubrication and wear life. The invention further relates to a process for the ion bombardment of fullerene materials, including but not limited to, $C_{60}$ fullerene materials to improve their tribological properties.

5 Claims, 3 Drawing Sheets

OTHER PUBLICATIONS

Ajie et al., "Characterization of the Soluble All–Carbon Molecules $C_{60}$ and $C_{70}$", *J. Phys. Chem.*, vol. 94, 1990, pp. 8630–8633.

Haufler et al., "Carbon Arc Generation of $C_{60}$", Mat. Res. Soc. Symp. *Proc.*, vol. 206, 1991, pp. 627–637.

Peters et al., "A New Fullerene Synthesis", Anggnew. Chem. Int. Ed. *Engl.* vol. 31, No. 2, 1992, pp. 223–224.

Yoshie et al., "Novel Method for $C_{60}$ synthesis: A thermal plasma at atmospheric pressure", *Appl. Phys. Lett.*, vol. 61, No. 23, 1992, pp. 2782–2783.

Howard et al., "Fullerenes $C_{60}$ and $C_{70}$ in flames", *Nature*, vol. 352, 1991, pp. 139–141.

Scrivens et al., "Purification of Gram Quantities of $C_{60}$. A New Inexpensive and Facile Method", J. Am. Chem. Soc., vol. 114, 1992, pp. 7917–7919.

METHOD FOR COATING FULLERENE MATERIALS FOR TRIBOLOGY

This is a continuation of application Ser. No. 08/075,135, filed Jun. 10, 1993, now abandoned.

TECHNICAL FIELD

The present invention relates to closed-caged carbon molecules known as Buckminsterfullerenes, or fullerenes, their synthesis, and utility as a lubricant coating and additive.

BACKGROUND ART

Fullerenes have recently been investigated for novel synthetic approaches and new uses. These hydrocarbon compounds possess a form containing a network of pentagons and hexagons. The fullerenes have been found to have several different molecular weights, depending on how many carbon atoms are in the cage. One particular form of fullerene is the $C_{60}$ molecule which has the highest possible symmetry (icosahedral) and assumes the shape of a soccer ball.

Tribology is the science of friction, wear, and lubrication. Solid lubricants are of significant commercial importance, but require certain properties. It is desired to have a solid lubricant which has low surface energy, high chemical stability, weak intermolecular bonding, good transfer film forming capability and high load bearing capacity. Conventional solid lubricants such as $MoS_2$, graphite, and polytetrafluoroethylene (PTFE) have weak interlayer bonding which facilitate transfer of said materials to the mating surface. Such transfer films are partially responsible for low friction and wear. Graphite exhibits low friction in the presence of moisture and rather high friction in vacuum with an operating temperature limit of about 430° C. $MoS_2$ provides low friction at low humidity and in vacuum with an operating temperature limit of about 315 ° C. PTFE is a soft polymer that exhibits low friction and rather high wear and its use is limited only to light loads and moderate temperature (about 200° C.) applications. Ajie, et at., J. Phys. Chem., 1990, volume 94, pp. 8630–8633, and Haufler et at., Mat. Res. Soc. Symp. Proc. 1991, volume 206, pp. 627–637, teach a method of providing fullerenes by arc evaporation of pure graphite in helium atmosphere.

PCT patent application WO92/20622, published Nov. 26, 1992 for Howard, et at., teaches a method for synthesizing fullerenes in flames.

Fullerene soot containing $C_{60}$, $C_{70}$, and other higher fullerene molecules have been produced by other researchers using the following processes in addition to arc evaporation of pure graphite in helium atmosphere. Evaporation of isostatically pressed pure graphite, pyrolytic graphite, and amorphous carbon by heating inductively at about 2700° C. temperature and at a helium atmosphere of 150 Pa is reported by Peters and Jansen, Angew. Chem. Int. Ed. Engl. 1992, volume 31, No.2, pp. 223–224.

Yoshie et at., Appl. Phys. Lett. Dec. 7, 1992, volume 61, pp. 2782–2783, teaches the evaporation of carbon black, benzene, acetylene in a hybrid plasma that comprises a rf plasma and a dc arc jet in vacuum to atmospheric pressure to produce fullerenes.

Howard et at., Nature, Jul. 11, 1991, volume 352, pp. 139–141, teaches the formation of fullerenes from hydrocarbon combustion, in which the ratio of $C_{60}$ and $C_{70}$ and their yield depend on the temperature, pressure, carbon/oxygen ratio and the residence time in the flame.

Scrivens, et al., J. Am. Chem. Soc. 1992, volume 114, pp. 7917–7919, teaches a method for producing and purifying $C_{60}$ fullerenes.

However, not all prior art fullerene materials are good for tribology. Thus, a need exists for new materials that can provide low friction and low wear over a wide range of operating conditions. Such materials should ideally be able to impart such tribological properties alone and/or as an additive to improve the properties and performance of conventional liquid oil base lubricants, greases, organic polymers, and other organic and inorganic materials.

BRIEF DISCLOSURE OF INVENTION

The present invention relates to various methods for producing fullerene soot and fullerene films of improved purity and adhesion, relative to the purity and adhesion of fullerene films and materials deposited by prior art processes.

The invention also relates to the use of high purity fullerene materials, and fullerene-based materials (such as metallofullerenes, fluorinated fullerenes, and codeposition of fullerene and other solid lubricants) as a lubricant and as a solid additive to liquid or solid lubricants, greases, organic polymers, and other inorganic and organic materials, whereby significant improvements in wear life of lubricated surfaces results.

The invention further relates to a method for further reducing the coefficient of friction of fullerene materials by surface treatment processes, such as ion bombardment of said fullerene materials.

BRIEF DESCRIPTION OF DRAWINGS

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose.

DETAILED DESCRIPTION

Thus one object of the present invention is a method for preparing $C_{60}$-rich fullerene films or coatings by a deposition process. The deposition can be by sublimation, laser vaporization, sputtering, ion beam, spray coating, dip coating, roll-on or brush coating, and the like for providing improved tribology properties to a substrate.

More specifically, in one embodiment, the invention relates to a sublimation method for preparing fullerene coatings comprising exposing a fullerene source material, in the presence of a substrate, to reduced pressure and elevated temperature sufficient to sublime $C_{60}$ material from the fullerene source material onto said substrate, whereby a $C_{60}$-rich coating is deposited on said heated substrate, and the substrate temperature is controlled and the substrate is positioned at a distance from the fullerene source material such that the purity, adhesion and uniformity of the $C_{60}$-rich coating is improved relative to conventional fullerene coatings. The adhesion and mechanical properties of the coating can be significantly improved by modification in the sublimation process, e.g., by creating a plasma around the sublimation zone or by incorporation of concurrent impingement by an ion beam or inert or reactive gas species.

Coatings of the present invention can also be deposited by a sputtering process by bombarding high energy positive ions (and energetic neutrals) of heavy inert gas on the target made of fullerene powder. The target can be produced, for example, by hot pressing fullerene soot in high vacuum. In the sputtering deposition process, the substrate is positioned in front of the target so as to intercept the flux of ejected $C_{60}$ or other fullerene molecules. Adhesion and mechanical properties can be improved by increasing the kinetic energy of the fullerene molecules that are ejected from the target. The substrate temperature can be controlled by water cooling the sample.

$C_{60}$-rich films can also be applied on materials by an ion beam deposition process, wherein the coating of fullerene can be deposited from a stream of ionized $C_{60}$ or other fullerene molecules. $C_{60}$ molecules can be ionized by electron impact, laser desorption, and fast-atom bombardment. The adhesion and mechanical properties are affected by the kinetic energy of the ionized $C_{60}$ or other molecule beam and also in the manner by which these molecules are ionized.

Fullerene films can also be deposited by a variety of chemical deposition techniques, such as chemical dip, brushing, or spray. In these processes, the fullerene powder is mixed in a polymer resin (such as polytetrafluoroethylene, polyphenylene sulfide, poly(amide-imide), polyethylene, etc., and a solvent. The mixture is applied to the substrate by dipping, brushing, or spraying. The coated surface is dried (solvent evaporated) and cured. The binder provides cohesion and adhesion to the coating which retains the $C_{60}$ material.

Ion beam mixing can also be used according to the present invention for improved mechanical properties and interfacial adhesion. In this process, the $C_{60}$ molecules are embedded into a substrate by bombarding the thin (50–100 nm) film of $C_{60}$ with heavy inert ion species. This process provides a composite surface on the top (100 nm thick, depending on the energy and dose of the ions) with improved properties. Ion beam mixing can also be carried out during coating deposition. In this process, the coated surface is bombarded with ions during deposition.

Another object of the present invention is the use of fullerene materials as additives to improve the lubrication properties of liquid or solid lubricating oils, greases, organic polymers or copolymers, organic and inorganic materials. The organic polymers or copolymers herein can include, and are not limited to, polyethylene, polypropylene, polybutylene, polyamides, such as nylon, and the like, polyesters, polysulfones, polyacrylates, polymethylacrylates, metals, ceramics, polymethylmethacrylates, polystyrenes, epoxies, polyvinyl chloride, polyvinylidene, polyacetylene, and fluorinated polymers and copolymers and mixtures thereof. Inorganic materials can also be modified by the addition thereto of the fullerene materials of the present invention. Useful inorganic materials which can be modified by the inclusion of fullerenes include glasses and metals.

More specifically, the invention relates to a method for improving the wear life, coefficient of friction and other tribological properties of surfaces lubricated with a liquid or solid lubricant, said method comprising adding to the lubricant sufficient fullerene material.

Yet another object of the present invention is a method for reducing the coefficient of friction of fullerene materials comprising exposing fullerene material or molecules to ion bombardment sufficient to reduce the coefficient of friction.

Metal-containing fullerenes, or metallofullerenes, that contain single metal atoms, such as La@$C_{82}$, Y@$C_{82}$, and Fe@$C_{60}$ and multiple metal atoms, such as $La_2$@$C_{80}$, $Y_2$@$C_{82}$ are found to have higher electrical conductivity than do fullerene molecules without metal atoms. It is therefore believed that thermal conductivity of metallofullerenes will be better than that of fullerenes. The metal atoms are inserted inside the hollow fullerene cage by adding the metal compounds in the graphite rod during its are evaporation. The electrical, thermal, and other properties are primarily dependent on the type of metal atom. Improved thermal conductivity of the metal-containing fullerenes will conduct away the heat generated at the sliding contact. Thus metallofullerenes may exhibit improved friction and wear properties as compared to normal fullerenes.

Fluorinated carbon compounds are well known solid lubricants, including polytetrafluoroethylene (PTFE) and liquid perfluoropolyether lubricants. Fluorinated fullerene molecules ($C_xF_x$ or $C_xF_y$) will exhibit lubrication properties similar to or better than that of other fluorinated carbons. The fluorination is performed by exposing the fullerene soot to a fluorine gas at a pressure of several hundred Torr. The normal fullerene soot containing $C_{60}$ and $C_{70}$ is dried at, for example, 400° C., before fluorination to remove all traces of solvent. In this manner, molecules such as $C_{60}F_{60}$ and $C_{70}F_{70}$ will be prepared which may exhibit excellent tribological properties.

According to one embodiment of the present invention, fullerene films are deposited by sublimation onto the surface of a substrate, such as a silicon wafer. The adherent and high purity $C_{60}$ films of the present invention are produced by optimizing the deposition parameters, including but not limited to, fullerene source preheating, sublimation temperature, substrate temperature, orientation of the target substrate with respect to the fullerene vapor stream, and the distance between the fullerene source material and the target substrate. The following deposition parameters significantly affect the friction, wear, and adhesion properties of $C_{60}$-rich materials and other fullerene films and materials useful herein as additives:

1) Preheating of the fullerene source material at, for example, 350° C. to remove any solvent and other impurities which thereby improves the adhesion and purity of the $C_{60}$ film relative to conventional $C_{60}$ materials.

2) Sublimation temperature of the fullerene source material affects the deposition rate which in turn may also affect the growth of the $C_{60}$ film. The $C_{60}$ films of the present invention are preferably deposited by a sublimation process whereby the temperature of the fullerene source material ranges from about 450° to 550° C.

3) Elevated substrate temperature during the sublimation or other deposition technique provides an additional thermal energy to the fullerene molecules for settling down which improves the adhesion of the film significantly over prior art materials.

4) The position of the substrate relative to the fullerene source material vapor stream affects the thickness uniformity. Orthogonal position of the substrate relative to the fullerene vapor stream resulted in a fullerene film of uniform thickness.

5) The distance between the fullerene source material and the substrate affects the radial uniformity in thickness of the film. A distance of about 10 mm was found optimum.

In fact, it has been discovered that a certain mount of substrate preheating improves adhesion of the resulting film to the substrate, however, preheating at temperatures above about 250° Centigrade adversely affects adhesion. Preheating of the fullerene source material produces an improvement of the purity of the film. It is believed that preheating of the fullerene source material powder at about 350° C. helps in separating out the impurities, as these sublime at lower temperatures than does $C_{60}$. Increased amounts of $C_{70}$ and other impurities in the $C_{60}$-rich film have been found to increase the coefficient of friction and also the wear. Nevertheless, for some applications trace levels of $C_{70}$ may be desirably obtained in $C_{60}$-rich films by the present invention by reducing or eliminating the preheating of the fullerene source material. Thus $C_{60}$ films were deposited by sublimation process at substrate temperatures ranging from about 50° to 250° C. In this process, the fullerene source material and substrate were placed in a deposition chamber equipped with a heating means and heat sensors and subjected to preheating at, for example, 350° C. at reduced pressure of $10^{-6}$ Torr. The fullerene source was then subjected to reduced vapor pressure and increased temperature conditions sufficient to promote sublimation of the preferred $C_{60}$ fraction fullerene from the fullerene source onto the substrate. The fullerene source material temperature was kept constant at, for example, 450° to 550° C. The substrate onto which the fullerene coating was to be sublimed was preferably kept in the deposition chamber in a position perpendicular to the $C_{60}$ vapor stream coming from the fullerene source material.

Therefore, in a preferred embodiment of the present invention, $C_{60}$ deposition is achieved at relatively low condensation (i.e., substrate) temperatures, such as 50° to 250° C., and preferably from 50° to 100° C. from a fullerene source material, preheated before actual sublimation, to produce pure and adherent fullerene films suitable for tribological applications.

The friction and wear properties of the sublimed fullerene and $C_{60}$-rich films of the present invention are affected by their adhesion and purity which depend on the sublimation parameters. Two important sublimation parameters in the present invention are the preheating of the fullerene source prior to sublimation or other deposition, and the temperature of the substrate. Thus in a preferred embodiment, preheating the fullerene source to, for example, 350° Centigrade has provided significant improvements in the sliding wear lives of the $C_{60}$ films' interfacial adhesion. It is believed, but the inventors do not wish to be limited to the theory that, preheating of fullerene powder at 200° to 350° C. helps in separating out the fullerene oxides and solvent impurities, since these materials sublime at temperatures below the sublimation temperature range of $C_{60}$.

The fullerene source can be selected from the group consisting of carbon rich precursors, such as but not limited to, coal, hydrocarbons, crude oil fractions, soot from organic combustion, carbon black, diamond precursors, shale, graphite and mixtures thereof. Fullerene soot alone and in combination with other materials, such as graphite, $MoS_2$, and polytetrafluoroethylene are also useful fullerene source materials herein. This latter process produces a codeposition of a film comprising a $C_{60}$-rich material or other fullerene and a conventional lubricant. A preferred fullerene source material in the present invention is powdered graphite or graphite rods.

The substrates onto which the fullerene films of the present invention can be deposited are not limited, provided the substrate can withstand the sublimation process or other deposition process temperatures. Preferred substrates herein include silicon, stainless steel, steel, gold-coated glass, and mica, but the most preferred substrate is silicon, such as, for example, silicon film deposited by chemical vapor or plasma enhanced chemical vapor deposition techniques, or a silicon wafer produced by slicing a silicon single crystal, or polycrystalline silicon.

Figure 1:
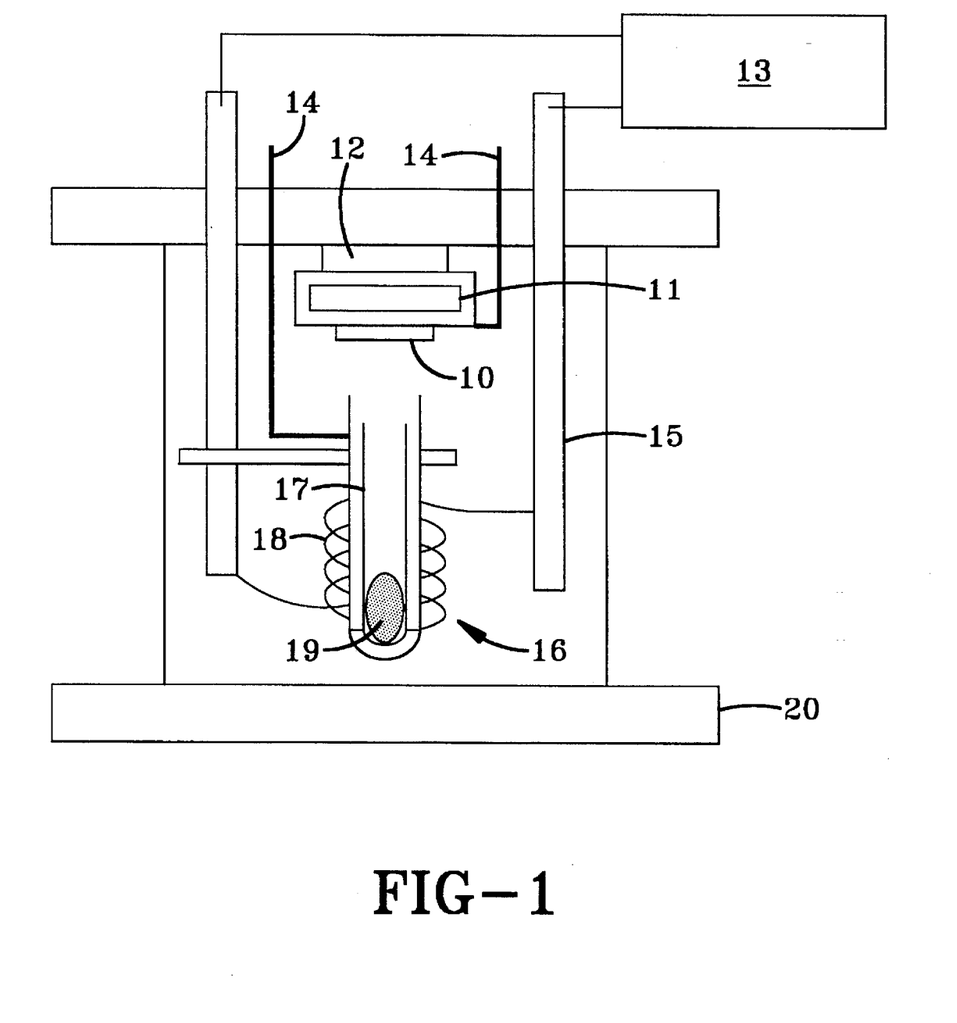
FIG. 1 illustrates a schematic diagram of a system for depositing $C_{60}$ fullerene coating on a substrate according to the present invention.

In one embodiment of the present invention, the fullerene source material is preheated at temperatures ranging from about 250° to 350° C. for a time sufficient to reduce or eliminate impurities. This time can be, for example, from about 15 to about 30 minutes, but such time periods are not limitations herein. The preheating is initiated after the fullerene source material and the target substrate are placed in a chamber or closed system and subjected to a vacuum of, for example, about $1\times10^{-6}$ Torr. FIG. 1 illustrates one embodiment of a sublimation apparatus employing the present invention.

FIG. 1 illustrates the components of one embodiment of the present invention. In FIG. 1, the substrate 10 is contacting a substrate heater 11, which is connected to a thermocouple 14. The substrate heater 11 can be protected with insulation 12 to improve the efficiency of the heat transfer from the heater 11 to the substrate 10. A quartz tube 16, located at a controlled distance from the heated substrate 10, is surrounded with a tungsten wire 18 as a heating means. Within the quartz tube 16 with the heating wire 18 is another quartz tube 17 used to hold the fullerene source material 19. A DC power supply 13 provides electrical energy to the heater 11 through the electrical feedthrough 15 and tungsten heating wire 18. The thermocouples 14 can register the temperatures of the substrate heater 11 and fullerene source material 19. The entire system is connected to a vacuum pumping system 20.

The sublimation apparatus of FIG. 1 mainly consists of a quartz tube containing $C_{60}$ powder and a substrate heater which was mounted on the top of the tube. The quartz tube containing the $C_{60}$ source material was inserted in to another quartz tube around which a tungsten wire was wrapped for heating. The tungsten wire was heated by means of a dc supply with an energy of about 100 watt. The substrate was silicon and was mounted on the heater so as to face the quartz tube. The whole assembly was enclosed in a vacuum chamber which was evacuated up to $10^{-6}$ Torr by means of a diffusion and mechanical pump. The powers of the substrate heater and the quartz tube heater were controlled through the use of variacs in order to get precise variations in the temperatures.

By the present invention, pure and uniformly thick $C_{60}$ films with yellow coloration are deposited on a substrate by the sublimation technique. The color of the sublimed $C_{60}$ films is an indication of its purity, and said color is responsive to the sublimation and preheating temperatures.

The fullerene source materials useful in the present invention were preferably, and not by way of limitation herein, synthesized and purified by a process of evaporating; or subliming, graphite rods, or other fullerene sources, in a 150 Torr He atmosphere using, for example, an alternating current electric arc welder. The soot produced by the vaporization of the graphite rods was collected from the chamber. Raw fullerene material was extracted from the soot with about a 10% yield by dissolving the soot in toluene and filtering it to yield a red solution. The toluene extract from the carbon arc soot contains 70–85% $C_{60}$ and 10–15% $C_{70}$ with the remainder being higher fullerenes and impurities. To obtain $C_{60}$ free from the higher molecular weight fullerenes, a flash chromatography purification method was used. A preliminary infrared analysis indicated that impurities (hydrocarbon) were extracted from the soot and passed through the column in addition to $C_{60}$. The extracted $C_{60}$ material was washed with diethyl ether several times. The residual material was then redissolved in toluene to facilitate the evaporation of ether which was found to stick to the $C_{60}$. After the toluene and residual ether were evaporated off, an infrared analysis indicated a high degree of purity in the $C_{60}$.

The $C_{60}$ fullerene films were deposited on polished (111) silicon wafer by sublimation at a high vacuum of $10^{-6}$ Torr. For ease of handling, several milligrams of the purified $C_{60}$ was dissolved in toluene and the solution was placed into a 12-mm diameter quartz tube. The tube was placed in a desiccator and the toluene was pumped off with a mechanical pump leaving a coating of $C_{60}$-rich powder on the interior of the quartz sample tube. The silicon substrate samples or coupons to be coated were placed on the top of the quartz tube containing the fullerene source material which was the purified $C_{60}$ extract. The distance between the silicon substrate and the quartz tube was kept about 10 mm, but can be 5 to about 20 min. After pumping to a pressure of about $10^{-6}$ Torr, the tube was heated to a temperature of 450° C. to sublime $C_{60}$. Evacuation was necessary to avoid any oxidation of $C_{60}$ during sublimation process as $C_{60}$ starts to oxidize above about 200 ° C. in the presence of oxygen. The sublimed yellowish fullerenes were deposited on the silicon substrate facing the $C_{60}$ vapor stream. The coating thickness obtained on the silicon substrate was related to the distance of the substrate from the purified $C_{60}$ fullerene source, wherein the coating was thicker on the center of the substrate. Thickness of the coatings for tribological studies ranged from 2 to 5 microns, with a variance of coating thickness of no more than 100 nanometers. At a distance of about 10 mm from the fullerene source, the silicon substrate received a sublimed $C_{60}$ coating of 2 microns thick while at a distance of 15 to 20 mm from the fullerene source, a sublimed $C_{60}$ coating of ½ microns was attained. Distances of the substrate from the fullerene source can range from about 5 to about 20 mm. Further, greater distances of the substrate from the fullerene source results in reduced adhesion of the $C_{60}$ coating to the substrate. Thus it has been shown that adhesion of $C_{60}$-rich coatings to silicon is maximized when the silicon substrate is located about 10 mm from the source of $C_{60}$ being sublimed.

Friction and wear tests were carried out in the present invention on a macro scale using a ball-on-flat reciprocating tribometer. The AISI E52100 ball bearing steel ball with a diameter of 5 mm and surface finish of about 3 nm rms was fixed in a stationary holder and the $C_{60}$ coated silicon disks or coupons were mounted on a reciprocating table. The weight of the ball holder and the arm was balanced by a counter weight and the normal load was applied by placing the dead weights on the top of the ball holder. The friction force was measured with a strain gage ring and data were digitized and collected on a personal computer. The fullerene coated silicon coupons were positioned using a x-y stage. The reciprocating motion was accomplished with a stepper motor in order to precisely control the sliding speed and track lengths. The number of steps per revolution ranged from 200 to 50,000 with a step size of 0.2 micrometers. The frequency of reciprocation can be varied from 0.1 to 10 Hz. The typical values of the track length ranged from a few tens of microns to a few millimeters and sliding speed ranged from a fraction of a millimeter to a few hundred millimeters per second. These tests were repeated three to four times on identical samples and the variation in the measured friction was less than 10 percent. The typical test conditions were as follows: reciprocating amplitude 2.4 ram, frequency 1 Hz, normal load 1N, average linear speed 2.4 mm/s, temperature 20° C., and atmospheric conditions/humidity 20 to 30% RH.

Microfriction measurements were made using a modified atomic force microscope. Each data point corresponds to an average over a 1 micron ×1 micron area. The typical scanning speed in measurement was 4 microns/second. The step size was 4 nm. The normal load applied during microfriction measurements ranged from 20 to 100 nN. The value of the coefficient of friction was obtained by calculating the slope of the normal versus friction force plots.

The results of the macro and microfriction testing of the $C_{60}$ of the present invention indicated that the purity of the $C_{60}$ films affects the coefficient of friction on an atomic level as well as on a macro level.

In another embodiment of the present invention, $C_{60}$ powder is used as an additive to conventional liquid or semi-liquid lubricants and solids to improve the lubricants' fiction and wear characteristics. By "liquid or semi-liquid" herein is meant any liquid, gel, gum, grease, or the like used to lubricate a surface. Thus by the present invention, $C_{60}$ powder is added to, for example, paraffinic base oil lubricant. The coefficient of fiction and wear of steel ball (AISI E52100) sliding against a hardened steel disk was measured in the presence of such a base oil with and without the $C_{60}$. The tests were conducted under a reciprocating mode of sliding. It has been discovered that the addition of from 0.5 to 5 weight % of $C_{60}$ to the base oil resulted in a reduction of wear scar width on the steel disk from 300–380 microns in the absence of $C_{60}$ to 120–130 microns with the addition of the $C_{60}$. In addition, the diameter of the wear scar on the mating steel ball was reduced from 200 microns to 75 microns by the addition of the $C_{60}$ powder to the base oil. The coefficient of fiction of steel sliding against steel in the presence of lubricating oil having 0.6 weight percent $C_{60}$ was observed to be about 20% lower than that of the oil without $C_{60}$. This illustrates the utility of $C_{60}$ as an additive to liquid lubricants and greases to improve tribological performance.

Table 1 shows the comparison of wear scars on steel disk and steel ball as a result of sliding one against the other in the absence of 100P base oil with and without $C_{60}$, graphite, and $MoS_2$ and a commercially available graphite (5 weight %) mixed petroleum base oil. The loop base oil used was obtained from National Oil Products, Hamilton, Ohio and its composition is 68% paraffinics, 28% naphthenes, and 4% aromatics. The graphite mixed oil was obtained from Acheson Colloids Company, Port Huron, Mich. Table 1 illustrates that fullerenes are as good as or better than conventional additives for reducing wear scars and the coefficient of friction.

TABLE 1

Comparison of wear scars on steel disk and steel ball and coefficient of friction as a result of sliding in the presence of 100 Pbase oil with $C_{60}$ and $MoS_2$ and commercial graphite mixed oil.

| Parameter | 100 P | 100 P $C_{60}$ | 100P+ graphite | 100 P+$MoS_2$ | Graphite mixed oil (Achesion) |
|---|---|---|---|---|---|
| Wear scar dimensions in microns A. Steel disk (3 nm rms roughness) | | | | | |
| (i) Width of scar | 300–380 | 120–130 | 200 | 140–200 | 170–180 |
| (ii) Depth of scar | 0.14–0.18 | 0.15 | 0.13 | 0.14 | 0.07–0.11 |
| B. Steel ball (3–5 nm rms roughness) | | | | | |
| (i) Diameter of scar | 200 | 75 | 80 | 70 | 50 |
| C. Coefficient of friction | | | | | |
| initial | 0.07 | 0.06 | 0.09 | 0.10 | 0.06 |
| After 20 m sliding | 0.08 | 0.07 | 0.10 | 0.10 | 0.07 |

Test conditions: Normal load-3 N; sliding speed-6 mm/s; track length-3mm; sliding distance-24 meters; temperature-20° C.; environment- ambient.

The coefficient of friction and wear lives of the $C_{60}$ films can also be further improved significantly by bombarding said films with inert gaseous ions. For example, a coefficient of friction of 0.09 and an improvement in wear life by a factor of 3 was achieved in the present invention by ion bombardment of the $C_{60}$ film using $Ar^+$ ions with $10^{16}$ ions/cm$^2$.

Thus the present invention also relates to a method for improving the coefficient of friction and wear life of a lubricant or lubricant additive, particularly a $C_{60}$ fullerene material, comprising exposing the fullerene material lubricant or fullerene additive to ion bombardment sufficient to reduce the coefficient of friction thereof.

Figure 2A:
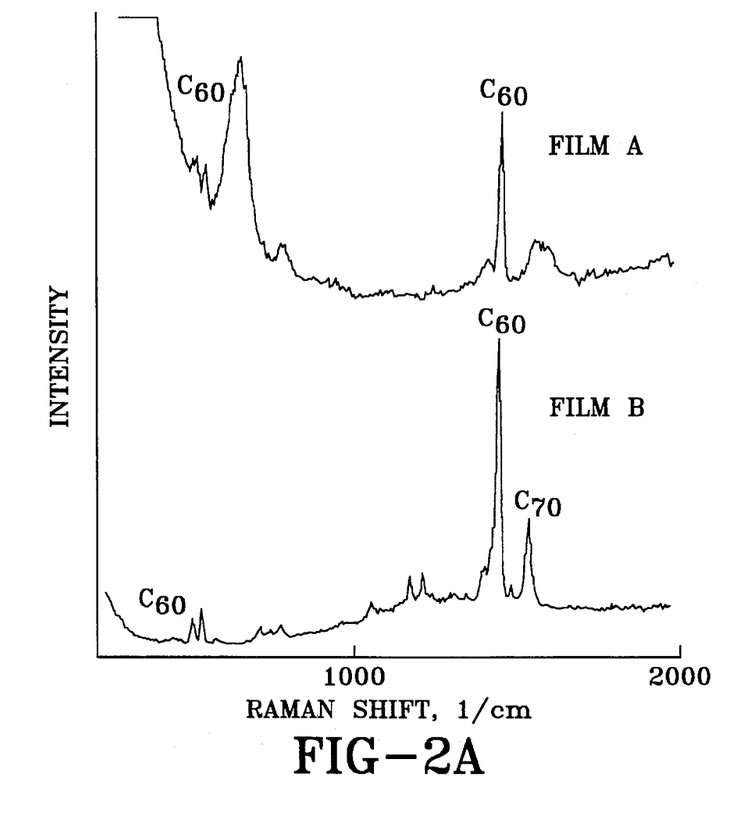
FIG. 2(a) illustrates a comparison of Raman spectrum for a $C_{60}$ rich film (Film A) produced according to the present invention, compared to the Raman spectrum a $C_{60}$ film (Film B) contaminated with $C_{70}$ and impurities.
Figure 2B:
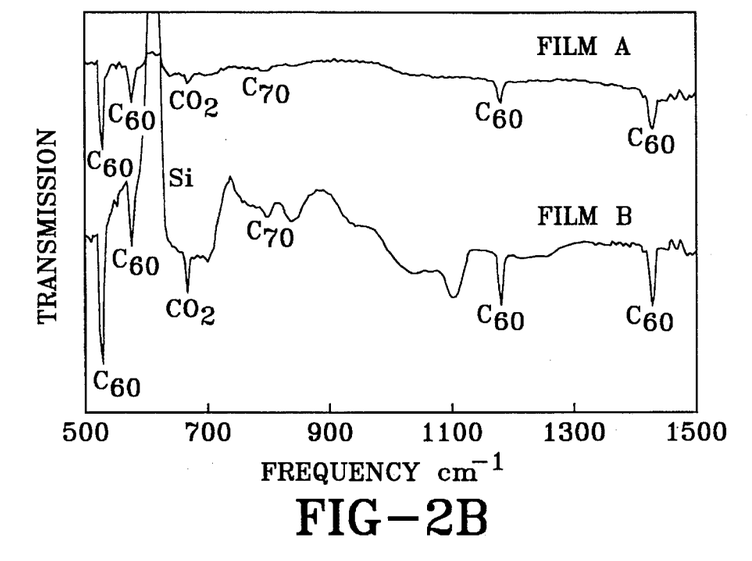
FIG. 2(b) illustrates a comparison of FTIR spectrum for a $C_{60}$ rich Film (Film A) produced according to the present invention, compared to the Raman spectrum a $C_{60}$ film (Film B) contaminated with $C_{70}$ and impurities.

FIG. 2 illustrates comparative Raman and FTIR spectra for $C_{60}$-rich films of the present invention compared to fullerene films which contain $C_{70}$. Raman spectra of ion bombarded $C_{60}$ films (not shown in FIG. 2) of the present invention at both doses do not show any peak corresponding to $C_{60}$, however a hump is present in the Raman spectrum at about 1550 cm$^{-1}$ corresponding to amorphous carbon.

Figure 3:
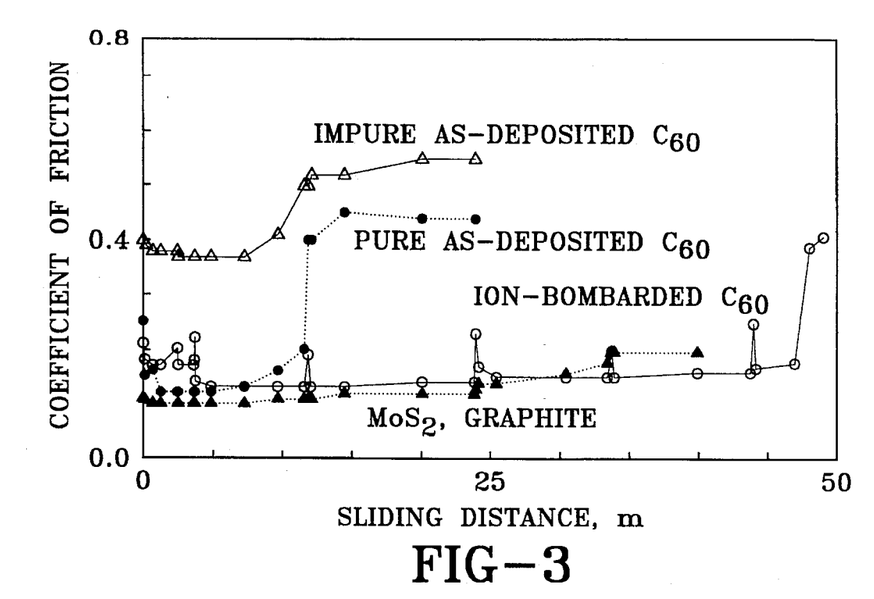
FIG. 3 illustrates a graph of the coefficient of friction versus sliding distance for impure as-deposited $C_{60}$, pure as-deposited $C_{60}$, ion implanted $C_{60}$, and $MoS_2$, graphite as a control.

FIG. 3 illustrates a graph of the coefficient of friction versus sliding distances for deposited $C_{60}$ films and ion implanted $C_{60}$ films and $MoS_2$, graphite films. As noted in FIG. 3, the sliding distance at which the coefficient of friction changes significantly is greater for the $C_{60}$-rich films of the present invention compared to the impure fullerene films. FIG. 3 also shows that ion implanted $C_{60}$-rich films of the present invention are as good as the conventional $MoS_2$, graphite lubricant films.

In another embodiment of the present invention, it has been discovered that ion bombardment of the $C_{60}$ molecules under certain conditions can further reduce the coefficient of friction. Thus, $Ar^+$ bombardment of $C_{60}$ with $1\times10^{16}$ ions/cm$^2$ reduced the coefficient of friction down to about 0.1 and gave a three-fold increase in wear life. It is believed that high doses ($5\times10^{16}$ ions/cm$^2$) of Argon ion bombardment disintegrate the $C_{60}$ molecules. In a preferred embodiment the ion beam is argon at a dose of from $1\times10^{16}$ ions/cm$^2$ to less than $5\times10^{16}$ ions/cm$^2$.

Ion implantation and ion beam mixing are known techniques which introduce a foreign species into a host material. Because of the higher kinetic energy of the implanted ion, it is possible to modify the physical and/or chemical properties of the host material near its surface, changing the friction and wear characteristics to a great extent. One effect of ion implantation is that it can create lattice damage in the chemical or physical structure of the host material.

By the present invention, $C_{60}$ fullerene coatings were bombarded with high energy (100 keV) argon ions at ion current densities of 20 to 40 microamps/cm$^2$ and ion doses ranging from $1\times10^{16}$ to $5\times10^{16}$ ions/cm$^2$. Other ions useful in the present invention for ion bombardment of $C_{60}$ fullerene materials to improve tribological properties include nitrogen, and hydrogen, however, argon ion is the preferred ion herein. The argon ion beam was electrostatically scanned with a sweeping system in order to obtain a laterally uniform ion bombardment. The typical values of projected range and range straggling for $Ar^+$ implanted at 100 keV into $C_{60}$ coated silicon wafers are 110 nm and 27 nm, respectively. These ion-bombarded fullerene coatings on silicon were tested for friction and wear using 52100 steel ball testing.

The purity and presence of $C_{60}$ in the as-deposited and ion-bombarded sublimed films were determined by Raman and Fourier Transform Infrared Spectroscopy (FTIR). Raman measurements were performed at room temperature using a Spex 1403. Excitation was by means of 514.5 nm radiation of an Argon ion laser with an output of about 100 mW. The instrument was equipped with a microprobe with a focal spot size on the order of a few tens of microns. The FTIR measurements were made on a Perkin Elmer infrared spectrometer in the transmission mode where the typical size of the beam was about 8 mm in diameter and the resolution was 0.5 cm$^{-1}$. The effects of the infrared absorptions of the substrate were compensated for by taking the ratio of the spectra of the specimen and the silicon substrate.

Coefficients of friction were measured for $MoS_2$ film on silicon for comparison to the $C_{60}$ sublimed film and the $Ar^+$ ion bombarded $C_{60}$ film. The $C_{60}$ film sublimed onto silicon exhibited a low coefficient of fiction (0.12), which is comparable to that of the $MoS_2$, one of the best known solid lubricants. A higher coefficient of friction of $C_{60}$ film sublimed on stainless steel as compared to the coefficient of fiction of $C_{60}$ on silicon is believed to be due to higher surface roughness of silicon that may affect the coating morphology. The low coefficient of friction of sublimed $C_{60}$ films on silicon is probably due to the formation of a transfer film of sublimed $C_{60}$ molecules on the mating surface, that is the 52100 steel ball. It has also been discovered herein that the wear debris generated during the sliding process consists of nearly spherical clusters of $C_{60}$ molecules. It is believed that these nearly spherical clusters roll during the sliding test, thereby maintaining low friction during further sliding.

Under macrofriction examination, the $C_{60}$ films which were bombarded with from $1 \times 10^{16}$ argon ions/cm$^2$ to less than $5 \times 10^{16}$ argon ions/cm$^2$ exhibited a lower coefficient of friction, reduced to 0.1 from the 0.12 value for sublimed $C_{60}$ films without ion bombardment. However, the films that were ion bombarded with higher doses, i.e., $5 \times 10^{16}$ ions/cm$^2$ or greater exhibited an increase in the coefficient of friction from 0.12 to 0.3. Reduction in the coefficient of friction of the sublimed $C_{60}$ films bombarded with light dose of Ar$^+$are believed to be attributed to the densification and generation of defects during ion bombardment which may be useful and effective in resisting crack nucleation and propagation. Bursts of higher friction can result during sliding from modified crack propagation behavior which can affect the wear particle formation process. The higher friction of the $C_{60}$ films bombarded with higher ion dose ($5 \times 10^{16}$ ions/cm$^2$) is probably the result of disintegration of $C_{60}$ molecules and formation of amorphous carbon.

Microfriction measurements on the ion bombarded $C_{60}$ films demonstrated a lower coefficient of friction, 0.09, of the bombarded films, for both the higher and lower ion doses, than that of the unbombarded $C_{60}$ fullerene films (0.12). This demonstrates that the disintegration of $C_{60}$ on ion bombardment at higher doses may be partial, and does not affect friction on an atomic scale, but only on a macro or molecular scale.

Ion bombarded $C_{60}$ films exposed at both radiation doses also surprisingly exhibited longer wear life, as much as 3.5 times that of the unbombarded films. Wear life in this sense is defined by the sliding distance during which the friction remains stable.

It has also been discovered that the coefficient of friction is strongly dependent on the purity of the $C_{60}$ film. According to the present invention, two $C_{60}$ rims were deposited under different substrate temperatures. The Raman and FTIR spectra (FIG. 2) obtained for these films established the presence in the first (higher deposition temperature) film, Film A, of $C_{60}$ by the occurence of strong peaks in the Raman spectrum at 1469 cm$^{-1}$ and 496 cm$^{-1}$. A peak at 1569 cm$^1$ corresponding to $C_{70}$ impurity was missing from the spectrum of the first film, but is present in the spectrum of the second film. The Raman spectrum of the second film, Film B, which was deposited farther away and at a lower temperature than the first film, includes several other peaks that correspond to $C_{70}$ and probably to some other impurities. The first film exhibited lower coefficient of friction (macro=0.12, micro=0.033) than that of the second film (macro=0.4, micro=0.12). High friction in the second film is possibly caused by the presence of $C_{70}$ and other impurities. Thus, to achieve a reduction in the coefficient of friction in a fullerene film, a preferred preheating temperature of the fullerene source and the substrate temperature are 350° C. and 50°–100° C., respectively, and the preferred distance between the fullerene source material and the substrate is less than about 20 millimeters, and more preferably is about 10.0 millimeters. In this manner, the present invention provides an improved method for the preparation of fullerene coatings with improved tribological performance, relative to fullerene coatings of conventional preparation techniques.

Figure 4:
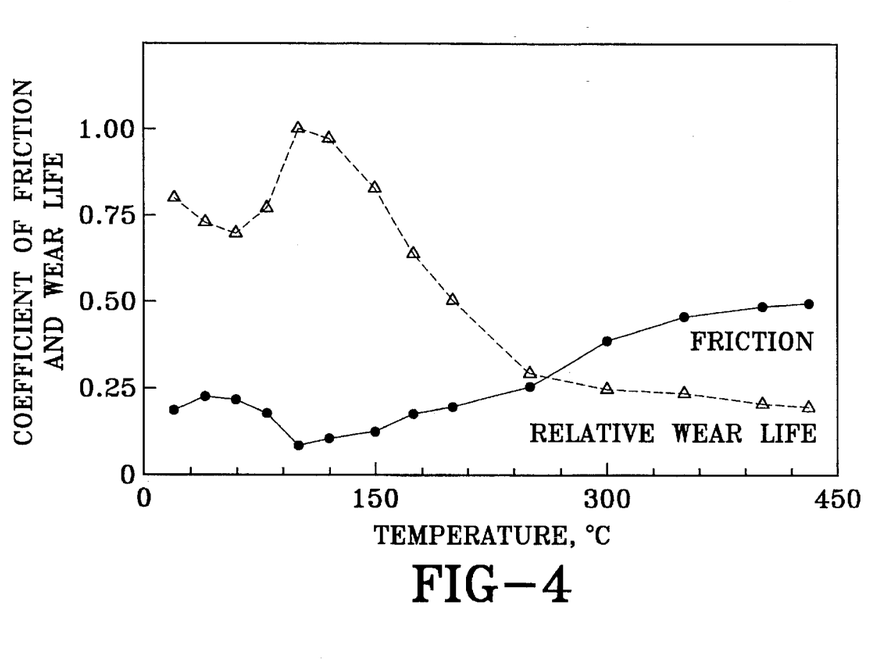
FIG. 4 illustrates a graph of the coefficient of friction and wear life of the $C_{60}$ materials of the present invention as a function of temperature.

It has also been discovered that the temperature during measurement of coefficient of friction testing has an effect on the results. FIG. 4 shows the results of coefficient of friction measurements and wear life measurements at different temperatures. The graphs of FIG. 4 demonstrate that the coefficient of friction of the fullerenes of the present invention varies with temperature. These data were generated by using the macrofriction device. There is a significant reduction in the coefficient of friction, from about 0.18 to about 0.08, when measured at the elevated temperature of 110° C. Higher friction and lower wear lives were observed at temperatures above 200° C. Optical microscopy of the worn surfaces showed that the low friction at 100° C. is due to more facile transfer of $C_{60}$ material to the steel ball than at ambient temperature. High friction at higher temperatures (>200° C.) result from partial oxidation of $C_{60}$ film and the generation of relatively less transfer film.

While certain preferred embodiments of the present invention have been disclosed in detail, it is to be understood that various modifications may be adopted without departing from the spirit of the invention or scope of the following claims.

That which is claimed is:

1. A method for improving the wear resistance of the surface of a substrate to exposure to sliding frictional engagement with another surface comprising the steps of;
   (a) heating said substrate to a temperature between about 50° to 250° C.;
   (b) exposing a fullerene source material containing $C_{60}$ in the presence of said heated substrate to a pressure of about $10^{-6}$ to $10^{-5}$ torr and a temperature of between about 450° C. to 550° C. and depositing a continuous, adherent, uniform coating of $C_{60}$ over the surface of said heated substrate.

2. The method of claim 1 wherein the substrate is selected from the group consisting of steel, gold-coated glass, and mica.

3. The method of claim 1 wherein the substrate is silicon.

4. The method defined in claim 1 wherein said substrate is disposed between about 10 to 15 mm from the fullerene source material.

5. The method defined in claim 1 wherein said substrate is heated to a temperature between about 50° to 100° in step (a).

* * * * *

UNITED STATES PATENT AND TRADEMARK OFFICE
CERTIFICATE OF CORRECTION

PATENT NO. : 5,558,903
DATED : Sep. 24, 1996
INVENTOR(S) : Bhushan et al.

It is certified that error appears in the above-indentified patent and that said Letters Patent is hereby corrected as shown below:

Column 1, lines 42, 43, 48, 60, and 65, change "et at." to --et al.--.  Column 4, line 28, change "are" to --arc--. Column 5, line 19, change "mount" to --amount--. Column 7, line 9, change "are" to --arc--; line 38, change "min." to --mm--.  Column 8, line 18, change "ram" to --mm--; lines 36, 40 and 51, change "fiction" to --friction--; line 61, change "loop" to --100P--.  Column 10, lines 59 and 63, change "fiction" to --friction--.  Column 11, line 1, change "bail" to --ball--; line 39, change "rims" to --films--.

Signed and Sealed this

Twenty-sixth Day of November 1996

Attest:

BRUCE LEHMAN

*Attesting Officer*          *Commissioner of Patents and Trademarks*